United States Patent
Jitjongruck et al.

(10) Patent No.: US 9,607,916 B2
(45) Date of Patent: Mar. 28, 2017

(54) ENCAPSULANT MATERIALS AND A METHOD OF MAKING THEREOF

(71) Applicants: MEKTEC MANUFACTURING CORPORATION (THAILAND) LTD, Ayutthaya (TH); CHULALONGKORN UNIVERSITY, Bangkok (TH)

(72) Inventors: Sathid Jitjongruck, Ayutthaya (TH); Anongnat Somwangthanaroj, Bangkok (TH)

(73) Assignees: MEKTEC MANUFACTURING CORPORATION (THAILAND) LTD, Ayutthaya (TH); CHULALONGKORN UNIVERSITY, Bangkok (TH)

( * ) Notice: Subject to any disclaimer, the term of this patent is extended or adjusted under 35 U.S.C. 154(b) by 162 days.

(21) Appl. No.: 14/390,992

(22) PCT Filed: Apr. 5, 2013

(86) PCT No.: PCT/TH2013/000017
§ 371 (c)(1),
(2) Date: Oct. 6, 2014

(87) PCT Pub. No.: WO2013/165324
PCT Pub. Date: Nov. 7, 2013

(65) Prior Publication Data
US 2015/0056756 A1 Feb. 26, 2015

(30) Foreign Application Priority Data
Apr. 5, 2012 (TH) .................. 1201001608

(51) Int. Cl.
*H01L 21/00* (2006.01)
*H01L 23/29* (2006.01)
*C09D 163/04* (2006.01)
*H01L 21/56* (2006.01)
*H01L 23/00* (2006.01)

(52) U.S. Cl.
CPC .......... *H01L 23/293* (2013.01); *C09D 163/04* (2013.01); *H01L 21/563* (2013.01); *H01L 24/29* (2013.01); *H01L 24/73* (2013.01); *H01L 24/92* (2013.01); *H01L 24/13* (2013.01); *H01L 24/16* (2013.01); *H01L 24/32* (2013.01); *H01L 24/81* (2013.01); *H01L 24/83* (2013.01); *H01L 2224/131* (2013.01); *H01L 2224/2929* (2013.01); *H01L 2224/2939* (2013.01); *H01L 2224/29387* (2013.01); *H01L 2224/73204* (2013.01); *H01L 2224/81191* (2013.01); *H01L 2224/81801* (2013.01); *H01L 2224/81815* (2013.01); *H01L 2224/83102* (2013.01); *H01L 2224/83192* (2013.01); *H01L 2224/83862* (2013.01); *H01L 2224/9211* (2013.01); *H01L 2924/0665* (2013.01)

(58) Field of Classification Search
None
See application file for complete search history.

(56) References Cited

U.S. PATENT DOCUMENTS

| | | | |
|---|---|---|---|
| 3,677,995 A * | 7/1972 | Mason | C08G 59/22 523/427 |
| 6,180,696 B1 | 1/2001 | Wong et al. | |
| 6,467,676 B1 * | 10/2002 | Wang | B23K 35/3613 228/180.22 |
| 6,680,436 B2 | 1/2004 | Xu et al. | |
| 7,279,223 B2 | 10/2007 | Rubinsztajn et al. | |
| 7,482,201 B2 | 1/2009 | Charles et al. | |
| 2003/0162911 A1 | 8/2003 | Xiao et al. | |
| 2003/0175521 A1 | 9/2003 | Kirsten | |
| 2005/0181214 A1 * | 8/2005 | Campbell | C01B 33/149 428/413 |
| 2005/0249901 A1 * | 11/2005 | Yializis | B32B 7/02 428/35.7 |
| 2006/0030682 A1 * | 2/2006 | Hurley | C08G 59/4284 525/485 |
| 2007/0212868 A1 * | 9/2007 | Sahasrabudhe | H01L 23/3157 438/613 |
| 2008/0265438 A1 | 10/2008 | Asano | |
| 2012/0021233 A1 | 1/2012 | Hayakawa et al. | |

OTHER PUBLICATIONS

Cabot. Untreated Fumed Silica. CAB-O-SIL M-5.2004. [retrieved on Oct. 6, 2014]. Retrieved from the Internet: <URL: http://talasonline.com/photos/instructions/fumed_silica_info.pdf>.
Gelest. Silane Coupling Agents. 2006. [retrieved on Oct. 6, 2014]. Retrieved from the Internet: <URL: http://www.gelest.com/goods/pdf/couplingagents.pdf>.

* cited by examiner

*Primary Examiner* — Angel Roman
(74) *Attorney, Agent, or Firm* — Novick, Kim & Lee, PLLC; Jae Youn Kim

(57) ABSTRACT

The present disclosure relates generally to encapsulant materials, a method of making thereof and the use thereof for maintaining the electrical and mechanical integrity of solder connections between electronic devices and substrates. More specifically, the present disclosure relates to reflow encapsulant materials with fluxing properties and a method of making thereof. The present disclosure further relates to a method of manufacturing flip-chip assemblies using the reflow encapsulant materials of the present disclosure wherein only one heating cycle is utilized.

6 Claims, No Drawings

ENCAPSULANT MATERIALS AND A METHOD OF MAKING THEREOF

FIELD OF TECHNOLOGY

The present disclosure relates generally to encapsulant materials, a method of making thereof and the use thereof for maintaining the electrical and mechanical integrity of solder connections between electronic devices and substrates. More specifically, the present disclosure relates to reflow encapsulant materials with fluxing properties and a method of making thereof. The present disclosure further relates to a method of manufacturing flip-chip assemblies using the reflow encapsulant materials of the present disclosure wherein only one heating cycle is utilized.

BACKGROUND

In the fabrication of flip-chip microelectronic assemblies, it is conventional to use a capillary flow underfill process which involves first making a circuit board by applying a fluxing agent onto a substrate, followed by a placement of flip-chips having solder bumps on the substrate, and subjecting the assembly to a first heating cycle to melt the solder bumps, so as to create operable interconnections between the substrate and the electronic elements in the flip-chips. A circuit board having flip-chips connected to the substrate is thereby formed. An underfill adhesive material is introduced only after the interconnections (or after the circuit board) has been fabricated. This typically involves a further step of applying the underfill adhesive material along the circuit board and allowing the underfill adhesive material to reflow into the spaces between the solder interconnections (i.e., the solder bumps) by capillary forces. The circuit board with the underfill adhesive material disposed thereon is then subjected to a second heating cycle so as to cure the underfill adhesive material, i.e., to cause cross-linked network bonding within the underfill adhesive material domain, but not to cause melting of the solder lest the interconnections formed during the first heating cycle are damaged. As can be seen, in the conventional process of making a flip-chip microelectronic assembly, two heating cycles are required. Since each heating cycle requires time for the temperature to be elevated to a desired level and time for cooling, there is a strong need to increase the efficiency of the flip-chip assembly process in terms of cutting down the production time and reducing the energy consumed.

Thus, there is a need for an improved encapsulant for use in a process of manufacturing flip-chip microelectronic assemblies wherein the time to produce the flip-chip assemblies and/or the energy consumed in the production of the flip-chip assemblies are reduced or minimized. Additionally, there is a need for an improved encapsulant for use in a process of manufacturing flip-chip assemblies wherein only one heating cycle is utilized and wherein a reflow underfill process is used for the arc welding of the circuit board to the substrate.

Further there is a need to develop an improved adhesive material that can be used when arc welding an electronic device and a substrate, wherein the thermal properties (i.e., both the glass transition temperature and thermal expansion coefficient) of the adhesive material are suitable for application of the adhesive material in packaging of electronic products.

U.S. Pat. No. 6,680,436 B2 is directed to the application of a reflow encapsulant to electronic devices and substrates. The reflow encapsulant of U.S. Pat. No. 6,680,436 B2 includes a formulation of a resin having epoxy and flexibilisers, hardener systems comprising epoxides and a cross-link agent, an inorganic additive present at about 8-20% by weight of the formulation, an organic salt catalyst, and a silane coupling agent. The cross-link agent reacts with the resin to form a cross-linked network and also serves as a fluxing agent.

In contrast to U.S. Pat. No. 6,680,436 B2, the present disclosure relates to a reflow encapsulant material that includes an epoxy resin, an anhydride curing compound, a metal acetylacetonate or a metal acetonate catalyst, an inorganic filler that includes alumina nanoparticles, and a fluxing agent having a hydroxyl group such as glycerol. The inventors found that if the fluxing agent of the present disclosure, which is used to flux the oxide on the surface of the solder bumps, was not added to the reflow encapsulant material, the solder bumps would not be reflowed and there would be no attachment between the substrate and flip-chips.

U.S. Pat. No. 6,467,676 B1 is directed to the development of a no-flow underfill encapsulant adhesive that is able to flux the oxide on the surface of solder bumps. The underfill encapsulant adhesive includes an epoxy resin, a curing agent, a catalyst, and a fluxing precursor of the hydroxyl type.

In contrast to U.S. Pat. No. 6,467,676 B1, the present disclosure relates to a reflow encapsulant material that includes alumina nanoparticles as the inorganic filler. The inventors found that if the inorganic filler alumina nanoparticles of the present disclosure were not incorporated in the reflow encapsulant material, the thermal properties of the reflow encapsulant material would not be suitable for application of the reflow encapsulant material. Moreover, when the alumina nanoparticles were incorporated into the reflow encapsulant material, the glass transition temperature of the reflow encapsulant material increased from 134.8° C. to 141.8° C. while the thermal expansion coefficient of the reflow encapsulant material decreased from 91.58 ppm/° C. to 35.68 ppm/° C.

US 2003/0162911 A1 is directed to the development of an underfill encapsulant material to be used in a no-flow encapsulant process. The underfill encapsulant material includes an epoxy resin, a curing agent, a catalyst, and a fluxing agent.

In contrast to US 2003/0162911 A1, the present disclosure relates to a reflow encapsulant material that includes alumina nanoparticles as an inorganic filler. The inventors found that if the inorganic filler alumina nanoparticles of the present disclosure were not incorporated in the reflow encapsulant material, the thermal properties of the reflow encapsulant material would not be suitable for application of the reflow encapsulant material. Moreover, when the alumina nanoparticles were incorporated into the reflow encapsulant material, the glass transition temperature of the reflow encapsulant material increased from 134.8° C. to 141.8° C. while the thermal expansion coefficient of the reflow encapsulant material decreased from 91.58 ppm/° C. to 35.68 ppm/° C.

US 2003/0175521 A1 is directed to arc welding of electronic devices and substrates to be used in flip-chip assemblies and in particular to the development of encapsulant material to be used in the encapsulant process. The adhesive encapsulant material of US 2003/0175521 A1 includes an epoxy resin, and a curing agent that cross-links the epoxy resin and also functions as a fluxing agent.

In contrast to US 2003/0175521 A1, the present disclosure relates to a reflow encapsulant material that includes an epoxy resin, an anhydride curing compound, a fluxing agent having a hydroxyl group such as glycerol, and alumina nanoparticles as an inorganic filler. The inventors found that if the fluxing agent of the present disclosure was not added to the reflow encapsulant material, the solder bumps would not be reflowed and there would be no attachment between the substrate and flip-chips. Further, the inventors found that if the inorganic filler alumina nanoparticles of the present disclosure were not incorporated in the reflow encapsulant material, the thermal properties of the reflow encapsulant material would not be suitable for application of the reflow encapsulant material.

U.S. Pat. No. 6,180,696 B1 is directed to the development of a no-flow underfill epoxy material to be used in a no-flow underfill process. The adhesive material of U.S. Pat. No. 6,180,696 B1 includes an epoxy resin, a curing agent, a catalyst, a fluxing agent, a diluent, a coupling agent, a surfactant, and fumed silica as an inorganic filler.

In contrast to U.S. Pat. No. 6,180,696 B1, the present disclosure relates to a reflow encapsulant material that includes alumina nanoparticles as an inorganic filler. The inventors found that when a silica inorganic filler was incorporated into the reflow encapsulant material in place of the alumina inorganic filler with a similar quantity as was used with alumina, then the thermal properties of the reflow encapsulant material were not suitable for application of the reflow encapsulant. On the other hand, when alumina nanoparticles were incorporated into the reflow encapsulant material, the glass transition temperature of the reflow encapsulant material increased from 119.7° C. to 141.8° C. while the thermal expansion coefficient of the reflow encapsulant material decreased from 51.10 ppm/° C. to 35.68 ppm/° C.

US 2008/0265438 A1 is directed to the development of an epoxy adhesive for use in the assembly of a flip-chip semiconductor device via a no-flow underfill process. The epoxy adhesive of US 2008/0265438 A1 includes an epoxy resin, a curing agent, a silica inorganic additive that can have an average size of about 0.1 to 1.0 micrometer, a desiccant, and a fluxing agent.

In contrast to US 2008/0265438 A1, the present disclosure relates to a reflow encapsulant material that includes an epoxy resin, an anhydride curing compound, a fluxing agent having a hydroxyl group such as glycerol, and alumina nanoparticles as an inorganic filler. The inventors found that when a silica inorganic filler was incorporated into the reflow encapsulant material in place of the alumina inorganic filler in a similar quantity as was used with alumina, then the thermal properties of the reflow encapsulant material were not suitable for application of the reflow encapsulant. On the other hand, when alumina nanoparticles were incorporated into the reflow encapsulant material, the glass transition temperature of the reflow encapsulant material increased from 119.7° C. to 141.8° C. while the thermal expansion coefficient of the reflow encapsulant material decreased from 51.10 ppm/° C. to 35.68 ppm/° C.

U.S. Pat. No. 7,482,201 B2 is directed to the preparation of an electronic article that includes an electronic device that is connected to a substrate via the use of an underfill adhesive, wherein the underfill adhesive is the reaction product of a thermosetting resin, a curing agent, and surface-treated silica nanoparticles. The silica nanoparticles are substantially spherical, non-agglomerated, amorphous, and solid. The silica nanoparticles have an average size of 5 to 600 nanometers and are added in a quantity of 30 to 70% by weight.

In contrast to U.S. Pat. No. 7,482,201 B2, the present disclosure relates to a reflow encapsulant material that includes an epoxy resin, an anhydride curing compound, a fluxing agent having a hydroxyl group such as glycerol, and alumina nanoparticles as an inorganic filler. The inventors found that if a silica nanoparticle inorganic filler was incorporated into the reflow encapsulant material in place of the alumina inorganic filler in a similar quantity as was used with alumina, then the thermal properties of the reflow encapsulant material were not suitable for application of the reflow encapsulant.

US 2005/0181214 A1 is directed to the preparation of an epoxy adhesive that can be cured. The formula of the epoxy adhesive includes an epoxy monomer and/or an epoxy oligomer, a curing agent, and organofunctionalized colloidal silica. The organofunctionalized colloidal silica have an average particle size of about 1 to 250 nanometers and are added in a quantity of about 0.001% to 90% by weight.

In contrast to US 2005/0181214 A1, the present disclosure relates to a reflow encapsulant material that includes an epoxy resin, an anhydride curing compound, a fluxing agent having a hydroxyl group such as glycerol, and alumina nanoparticles as an inorganic filler. The inventors found that if the glycerol fluxing agent was not incorporated into the reflow encapsulant material, then the solder bumps would not be reflowed when connecting the substrate and flip-chips. In addition, the inventors found that if a silica nanoparticle inorganic filler was incorporated into the reflow encapsulant material in place of the alumina inorganic filler in a similar quantity as was used with alumina, then the thermal properties of the reflow encapsulant material were not suitable for application of the reflow encapsulant.

SUMMARY

The present disclosure relates to a reflow encapsulant material that can include an epoxy resin that can be cured by heat, an anhydride curing compound, a catalyst, a fluxing agent, and an inorganic additive/inorganic filler. The epoxy resin can include a cycloaliphatic epoxy resin, a bisphenol epoxy resin, an epoxy novolac resin, a biphenyl epoxy resin, a naphthalene epoxy resin, a dicyclo pentadiene phenol epoxy resin or a combination of one or more thereof. The fluxing agent can have a hydroxyl group thereby allowing the fluxing agent to react with the anhydride curing compound to flux oxide from solder bumps during normal reflow conditions. In embodiments, if the fluxing agent of the present disclosure is not incorporated into the reflow encapsulant material, the solder bumps will not be reflowed when connecting an electronic device and a substrate. The catalyst can be a metal acetylacetonate, metal acetate or combination thereof. The inorganic additive/inorganic filler can be alumina nanoparticles, wherein the use of alumina nanoparticles improves the properties of the reflow encapsulant material for application in packaging of electronic products.

The present disclosure also relates to an improved adhesive material that can be used when arc welding an electronic device and a substrate, wherein the thermal properties (i.e., both the glass transition temperature and thermal expansion coefficient) of the adhesive material are suitable for application of the adhesive encapsulant material in packaging of electronic products.

A first aspect provides an encapsulant material that can include: an epoxy resin; an anhydride curing compound; a catalyst; a fluxing agent; and a nanoscale inorganic additive/inorganic filler.

A second aspect provides an encapsulant material that can consist essentially of: an epoxy resin; an anhydride curing compound; a catalyst; a fluxing agent; and a nanoscale inorganic additive/inorganic filler.

A third aspect provides an encapsulant material that can consist of: an epoxy resin; an anhydride curing compound; a catalyst; a fluxing agent; and a nanoscale inorganic additive/inorganic filler.

A fourth aspect provides a method of preparing the encapsulant material described above, wherein the method can include: providing an epoxy resin; providing an anhydride curing compound; providing a catalyst; providing a fluxing agent; providing a nanoscale inorganic additive/inorganic filler; and combining the epoxy resin, anhydride curing compound, catalyst, fluxing agent and nanoscale inorganic additive/inorganic filler.

A fifth aspect provides a method of forming an assembly of a substrate and a flip-chip having solder balls thereon, the method comprising the steps of: placing the flip chip with the solder balls in contact with the substrate to form a first interim assembly at a first predetermined temperature; providing the encapsulant material described above to the first interim assembly to form a second interim assembly at a second predetermined temperature that is lower than a melting temperature of the solder balls and at least as high as the first predetermined temperature; and subjecting the second interim assembly to an environment of a third predetermined temperature that is sufficient to melt the solder balls.

In embodiments, the epoxy resin of the encapsulant material described above can be a cycloaliphatic epoxy resin, a bisphenol A epoxy resin, a bisphenol F epoxy resin, an epoxy novolac resin, a biphenyl epoxy resin, a naphthalene epoxy resin, a dicyclo pentadiene phenol epoxy resin and a combination of one or more thereof.

In embodiments, the epoxy resin of the encapsulant material described above can be a mixture of a bisphenol A epoxy resin and a cycloaliphatic epoxy resin or a mixture of a bisphenol F epoxy resin and a cycloaliphatic epoxy resin.

In embodiments, the ratio of the bisphenol A epoxy resin to the cycloaliphatic epoxy resin can be about 1:3 to about 3:1. In embodiments, the ratio of the bisphenol F epoxy resin to the cycloaliphatic epoxy resin can be about 1:3 to about 3:1.

In embodiments, the ratio of the bisphenol A epoxy resin to the cycloaliphatic epoxy resin can be about 2:1. In embodiments, the ratio of the bisphenol F epoxy resin to the cycloaliphatic epoxy resin can be about 2:1.

In embodiments, the epoxy resin of the encapsulant material can be a mixture of a bisphenol A epoxy resin and a cycloaliphatic epoxy resin, wherein the bisphenol A epoxy resin is present in an amount of about 35.7% by weight of the encapsulant material and the cycloaliphatic epoxy resin is present in an amount of about 17.6% by weight of the encapsulant material.

In embodiments, the anhydride curing compound of the encapsulant material described above can be a hexahydrophthalic anhydride, a methylhexahydrophthalic anhydride or a combination of one or more thereof. In embodiments, the anhydride curing compound can be 4-methylhexahydrophthalic anhydride.

In embodiments, the anhydride curing compound can be present in an amount of about 20 grams to about 80 grams per about 100 grams of the epoxy resin. In embodiments, the anhydride curing compound can be present in an amount of about 65 grams per about 100 grams of the epoxy resin. In embodiments, the anhydride curing compound can be present in an amount of about 65% by weight of the epoxy resin. In embodiments, the ratio of the anhydride curing compound to the epoxy resin can be about 2:3. In embodiments, the anhydride compound can be present in an amount of about 34.5% by weight of the encapsulant material. These values are based on an uncured epoxy resin.

In embodiments, the catalyst of the encapsulant material described above can be a metal acetylacetonate, a metal acetate or a combination of one or more thereof.

In embodiments, the metal of the metal acetylacetonate can be a metal ion such as $Sc^{3+}$, $Cu^{2+}$, $Mo^{2+}$, $Ru^{3+}$, $Rh^{3+}$, $Cd^{2+}$, $Co^{2+}$, $Co^{3+}$, $Fe^{2+}$, $Fe^{3+}$, $Pd^{2+}$, $Pt^{2+}$, $Zn^{2+}$, $Mg^{2+}$ or a combination of one or more thereof. In embodiments, the metal of the metal acetate can be a metal ion such as $Sc^{3+}$, $Cu^{2+}$, $Mo^{2+}$, $Ru^{3+}$, $Rh^{3+}$, $Cd^{2+}$, $Co^{2+}$, $Co^{3+}$, $Fe^{2+}$, $Fe^{3+}$, $Pd^{2+}$, $Pt^{2+}$, $Zn^{2+}$, $Mg^{2+}$ or a combination of one or more thereof. In embodiments, the catalyst can be cobalt (II) acetylacetonate.

In embodiments, the catalyst can be present in an amount of about 0.2 grams to about 5.0 grams per about 100 grams of the epoxy resin. In embodiments, the catalyst can be present in an amount of about 1.0 gram to about 1.5 grams per about 100 grams of the epoxy resin. In embodiments, the catalyst is present in an amount of about 1.4 grams per about 100 grams of the epoxy resin. In embodiments, the catalyst can be present in an amount of about 1.4% by weight of the epoxy resin. In embodiments, the catalyst can be present in an amount of about 0.7% by weight of the encapsulant material. These values are based on an uncured epoxy resin.

In embodiments, the fluxing agent of the encapsulant material described above can be a fluxing agent having a hydroxyl group. In embodiments, the fluxing agent having a hydroxyl group can be ethylene glycol, propylene glycol, glycerol, glycerol D-ribose, diethylene glycol or a combination of one or more thereof. In embodiments, the fluxing agent having a hydroxyl group can be glycerol.

In embodiments, the fluxing agent can be present in an amount of about 1 gram to about 15 grams per about 100 grams of the epoxy resin. In embodiments, the fluxing agent can be present in an amount of about 8 grams per about 100 grams of the epoxy resin. In embodiments, the fluxing agent can be present in an amount of about 8% by weight of the epoxy resin. In embodiments, the fluxing agent can be present in an amount of about 4.3% by weight of the encapsulant material. These values are based on an uncured epoxy resin.

In embodiments, the nanoscale inorganic additive/inorganic filler of the encapsulant material described above can be nanoscale alumina including alumina nanoparticles.

In embodiments, the alumina nanoparticles can have an average particle size of about 800 nanometers or less. In embodiments, the alumina nanoparticles can have an average particle size of about 50 nanometers or less.

In embodiments, the alumina nanoparticles can be present in an amount of about 1 gram to about 30 grams per about 100 grams of the epoxy resin. In embodiments, the alumina nanoparticles can be present in an amount of about 10 grams to about 15 grams per about 100 grams of the epoxy resin. In embodiments, the alumina nanoparticles can be present in an amount of about 13.6 grams per about 100 grams of the epoxy resin. In embodiments, the alumina nanoparticles can be present in an amount of about 13.6% by weight of the epoxy resin. In embodiments, the alumina nanoparticles can be present in an amount of about 7.2% by weight of the encapsulant material. These values are based on an uncured epoxy resin.

In embodiments, the encapsulant material described above can be a reflow encapsulant material.

The encapsulant material of the present disclosure can be used in conventional processes for fabricating flip-chip microelectronic assemblies.

However, in contrast to conventional encapsulant materials, the encapsulant material of the present disclosure can also be effectively used in one-cycle heating processes for fabricating flip-chip microelectronic assemblies, for example, the hybrid no-flow process or the no-flow underfill process. Conventional encapsulant materials typically cannot be used effectively in one-cycle heating processes for fabricating flip-chip microelectronic assemblies such as the hybrid no-flow process or the no-flow underfill process.

In particular, the encapsulant material of the present disclosure is the only encapsulant material that can be effectively used in the novel and inventive single-stage heating method or hybrid method disclosed in the inventors' patent application entitled "Method and Encapsulant for Flip-Chip Assembly" having the same filing date as the present patent application. On the other hand, conventional encapsulant materials cannot be used in the novel and inventive single-stage heating method or hybrid method disclosed in the inventors' patent application entitled "Method and Encapsulant for Flip-Chip Assembly" having the same filing date as the present patent application. The inventors' patent application entitled "Method and Encapsulant for Flip-Chip Assembly" having the same filing date as the present patent application is incorporated herein by reference in its entirety.

DETAILED DESCRIPTION

The illustrative embodiments described in the following detailed description and claims are not meant to be limiting. Other embodiments can be utilized, and other modifications can be made, without departing from the spirit or scope of the subject matter presented herein.

Unless specified otherwise, the terms "comprising" and "comprise" as used herein, and grammatical variants thereof, are intended to represent "open" or "inclusive" language such that they include recited elements but also permit inclusion of additional, un-recited elements.

As used herein, the term "about", in the context of amounts of components of formulations, conditions, other measurement values, etc., means+/−5% of the stated value, or +/−4% of the stated value, or +/−3% of the stated value, or +/−2% of the stated value, or +/−1% of the stated value, or +/−0.5% of the stated value, or +/−0.4% of the stated value, or +/−0.3% of the stated value, or +/−0.2% of the stated value, or +/−0.1% of the stated value, or +/−0% of the stated value.

Throughout this disclosure, certain embodiments may be disclosed in a range format. It should be understood that the description in range format is merely for convenience and brevity and should not be construed as an inflexible limitation on the scope of the disclosed ranges. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

The present disclosure relates to a reflow encapsulant material that can include an epoxy resin, a curing agent, a catalyst, a fluxing agent, and an inorganic additive/inorganic filler.

In embodiments, the epoxy resin of the reflow encapsulant material can be a cycloaliphatic epoxy resin, a bisphenol A epoxy resin, a bisphenol F epoxy resin, a naphthalene epoxy resin, a dicyclopentadiene-phenol epoxy resin or a combination of one or more thereof. In embodiments, the epoxy resin can be a mixture of different epoxy resins, wherein such a mixture of epoxy resins can support or facilitate the control of curing kinetics, which allows the reflow encapsulant material of the present disclosure to be useful in the packaging of electronic products.

In embodiments, an epoxy resin including a mixture of epoxy resins and having a weight of 100 grams can have one of the epoxy resins present in an amount of about 25 to 75 grams. The remaining amount can include other epoxy resins.

In embodiments, the epoxy resin can include a mixture of diglycidyl ether of bisphenol A and a cycloaliphatic epoxy, such as, 3,4-epoxycyclohexylmethyl 3,4-epoxycyclohexanecarboxylate in the ratio of 1:3 to 3:1. In a preferred embodiment, the epoxy resin can include diglycidyl ether of bisphenol A and 3,4-epoxycyclohexylmethyl 3,4-epoxycyclohexanecarboxylate in a ratio of 2:1. In a preferred embodiment, the epoxy resin of the encapsulant material can be a mixture of diglycidyl ether of bisphenol A and 3,4-epoxycyclohexylmethyl 3,4-epoxycyclohexanecarboxylate, wherein diglycidyl ether of bisphenol A is present in an amount of about 35.7% by weight of the encapsulant material and 3,4-epoxycyclohexylmethyl 3,4-epoxycyclohexanecarboxylate is present in an amount of about 17.6% by weight of the encapsulant material.

In embodiments, the epoxy resin can include diglycidyl ether of bisphenol F mixed with a cycloaliphatic epoxy, such as, 3,4-epoxycyclohexylmethyl 3,4-epoxycyclohexanecarboxylate in the ratio of 1:3 to 3:1. In embodiments, the ratio of the diglycidyl ether of bisphenol F and the cycloaliphatic epoxy, such as, 3,4-epoxycyclohexylmethyl 3,4-epoxycyclohexanecarboxylate can be 2:1. In embodiments, the epoxy resin of the encapsulant material can be a mixture of diglycidyl ether of bisphenol F and 3,4-epoxycyclohexylmethyl 3,4-epoxycyclohexanecarboxylate, wherein diglycidyl ether of bisphenol F is present in an amount of about 35.7% by weight of the encapsulant material and 3,4-epoxycyclohexylmethyl 3,4-epoxycyclohexanecarboxylate is present in an amount of about 17.6% by weight of the encapsulant material.

In embodiments, the curing agent can be an anhydride curing compound such as a hexahydrophthalic anhydride, a methyl hexahydrophthalic anhydride or a combination of one or more thereof. In embodiments, the anhydride curing compound can be present in an amount of about 20 grams to about 80 grams per about 100 grams of the epoxy resin. In embodiments, the anhydride curing compound can be present in an amount of about 65 grams per about 100 grams of the epoxy resin. In embodiments, the anhydride curing compound can be present in an amount of about 65% by weight of the epoxy resin. In embodiments, the ratio of the anhydride curing compound to the epoxy resin can be about 2:3. In embodiments, the anhydride compound can be present in an amount of about 34.5% by weight of the encapsulant material. These values are based on an uncured epoxy resin.

In a preferred embodiment, the curing compound can be 4-methylhexahydrophthalic anhydride. In a preferred embodiment, 4-methylhexahydrophthalic anhydride is present in an amount of about 65 grams per about 100 grams of the epoxy resin. In a preferred embodiment, the 4-methylhexahydrophthalic anhydride compound is present in an amount of about 65% by weight of the epoxy resin. In a preferred embodiment, 4-methylhexahydrophthalic anhydride can be present in an amount of about 34.5% by weight of the encapsulant material. These values are based on an uncured epoxy resin.

In embodiments, the catalyst for the curing process can be a metal acetylacetonate, a metal acetate or a combination of one or more thereof. In embodiments, the metal of the metal acetylacetonate can be a metal ion such as $Sc^{3+}$, $Cu^{2+}$, $Mo^{2+}$, $Ru^{3+}$, $Rh^{3+}$, $Cd^{2+}$, $Co^{2+}$, $Co^{3+}$, $Fe^{2+}$, $Fe^{3+}$, $Pd^{2+}$, $Pt^{2+}$, $Zn^{2+}$, $Mg^{2+}$ or a combination of one or more thereof.

In embodiments, the metal of the metal acetate can be a metal ion such as $Sc^{3+}$, $Cu^{2+}$, $Mo^{2+}$, $Ru^{3+}$, $Rh^{3+}$, $Cd^{2+}$, $Co^{2+}$, $Co^{3+}$, $Fe^{2+}$, $Fe^{3+}$, $Pd^{2+}$, $Pt^{2+}$, $Zn^{2+}$, $Mg^{2+}$ or a combination of one or more thereof.

In embodiments, the catalyst can be present in an amount of about 0.2 grams to about 5.0 grams per about 100 grams of the epoxy resin. In embodiments, the catalyst can be present in an amount of about 1.0 gram to about 1.5 grams per about 100 grams of the epoxy resin. In embodiments, the catalyst is present in an amount of about 1.4 grams per about 100 grams of the epoxy resin. In embodiments, the catalyst can be present in an amount of about 1.4% by weight of the epoxy resin. In embodiments, the catalyst can be present in an amount of about 0.7% by weight of the encapsulant material.

In a preferred embodiment, the catalyst can be cobalt (II) acetylacetonate. In a preferred embodiment, cobalt (II) acetylacetonate can be present in an amount of about 1.4 grams per about 100 grams of the epoxy resin. In a preferred embodiment, cobalt (II) acetylacetonate can be present in an amount of 1.4% by weight of the epoxy resin. In a preferred embodiment, cobalt (II) acetylacetonate can be present in an amount of about 0.7% by weight of the encapsulant material. These values are based on an uncured epoxy resin.

In embodiments, the fluxing agent can have a hydroxyl group. In embodiments, the fluxing agent having a hydroxyl group can be ethylene glycol, propylene glycol, glycerol D-ribose, diethylene glycol or a combination of one or more thereof.

In embodiments, the fluxing agent amount can affect and/or influence the storage modulus of the encapsulant material of the present disclosure. In embodiments, the fluxing agent can be present in an amount of about 1 gram to about 15 grams per about 100 grams of the epoxy resin. In embodiments, the fluxing agent can be present in an amount of about 3 grams to about 10 grams per about 100 grams of the epoxy resin. In embodiments, the fluxing agent can be present in an amount of about 8 grams per about 100 grams of the epoxy resin. In embodiments, the fluxing agent can be present in an amount of about 8% by weight of the epoxy resin. In embodiments, the fluxing agent can be present in an amount of about 4.3% by weight of the encapsulant material.

In a preferred embodiment, the fluxing agent can be glycerol. In embodiments, the amount of glycerol present in the encapsulant material can affect and/or influence the storage modulus of the encapsulant material of the present disclosure. In a preferred embodiment, glycerol can be present in an amount of about 8 grams per about 100 grams of the epoxy resin. In a preferred embodiment, glycerol can be present in an amount of 8% by weight of the epoxy resin. In a preferred embodiment, glycerol can be present in an amount of about 4.3% by weight of the encapsulant material. These values are based on an uncured epoxy resin.

In embodiments, the inorganic additive/inorganic filler is used for improving the mechanical and thermal properties of the reflow encapsulant material. In embodiments, the inorganic additive/inorganic filler can be a nanoscale inorganic additive/inorganic filler. In embodiments, the nanoscale inorganic additive/inorganic filler of the encapsulant material described above can be alumina nanoparticles. Other inorganic additives/inorganic fillers are also contemplated. Other nanoscale additives/inorganic fillers are also contemplated.

In embodiments, the alumina nanoparticles can have an average particle size of about 800 nanometers or less. In embodiments, the alumina nanoparticles can have an average particle size of about 50 nanometers or less. In a preferred embodiment, the alumina nanoparticles have an average particle size of about 50 nanometers.

In embodiments, the alumina nanoparticle amount can affect and/or influence the glass transition temperature of the encapsulant material of the present disclosure. In embodiments, the alumina nanoparticles can be present in an amount of about 1 gram to about 30 grams per about 100 grams of the epoxy resin. In embodiments, the alumina nanoparticles can be present in an amount of about 10 grams to about 15 grams per about 100 grams of the epoxy resin. In a preferred embodiment, the alumina nanoparticles can be present in an amount of about 13.6 grams per about 100 grams of the epoxy resin. In a preferred embodiment, the alumina nanoparticles can be present in an amount of 13.6% by weight of the epoxy resin. In a preferred embodiment, the alumina nanoparticles are present in an amount of 7.2% by weight of the encapsulant material. These values are based on an uncured epoxy resin.

In embodiments, the viscosity of the encapsulant material of the present disclosure at room temperature can be less than about 8000 cP (centipoise). In embodiments, the viscosity of the encapsulant material at room temperature can be about 3000 cP to about 5000 cP. In embodiments, the viscosity of the encapsulant material at room temperature can be about 2500 cP to about 4100 cP. In embodiments, the viscosity of the encapsulant material at room temperature can be about 4000 cP.

In embodiments, the glass transition temperature of the encapsulant material of the present disclosure can be about 127° C. to about 130° C.

In embodiments, the storage modulus of the encapsulant material of the present disclosure can be about 2 GPa to about 2.4 GPa (at 30° C., 1 Hz).

In embodiments, the encapsulant material of the present disclosure is heat-curable.

In accordance with a preferred embodiment of the present disclosure, the encapsulant material can include: a mixture of diglycidyl ether of bisphenol A and 3,4-epoxycyclohexylmethyl 3,4-epoxycyclohexanecarboxylate, wherein diglycidyl ether of bisphenol A is present in an amount of about 35.7% by weight of the encapsulant material and 3,4-epoxycyclohexylmethyl 3,4-epoxycyclohexanecarboxylate is present in an amount of about 17.6% by weight of the encapsulant material; 4-methylhexahydrophthalic anhydride present in an amount of about 34.5% by weight of the encapsulant material; cobalt (II) acetylacetonate present in an amount of about 0.7% by weight of the encapsulant material; glycerol in an amount of about 4.3% by weight of the encapsulant material; and alumina nanoparticles present in an amount of 7.2% by weight of the encapsulant material. An encapsulant material having the above mentioned components in the above mentioned amounts results in an improved adhesive encapsulant material having a glass transition temperature of about 130° C., a thermal expansion coefficient or coefficient of thermal expansion of about 53.23 ppm/° C., a viscosity of about 4100 cP (at room temperature), a loss modulus of about 90 MPa (at 30° C., 1 Hz) and/or a storage modulus of about 2.4 GPa (at 30° C., 1 Hz) that are suitable and/or advantageous for application of the adhesive encapsulant material in the packaging of electronic products. A reflow encapsulant material having the above mentioned components in the above mentioned amounts results in an unexpected and surprising synergy of thermal properties (i.e., glass transition temperature and coefficient of thermal expansion) and rheological properties (i.e., loss modulus, storage modulus and viscosity) that provide improved results with respect to solder bumps being reflowed and with respect to a substrate and flip-chips effectively attaching.

The glass transition temperature of the encapsulant material of the present disclosure was measured using the Dynamic Mechanical Analysis (DMA) technique. The glass transition temperature value(s) was obtained from tan delta at 1 Hz. The coefficient of thermal expansion of the encapsulant material of the present disclosure was measured using the Thermomechanical Analysis (TMA) technique. The viscosity of the encapsulant material of the present disclosure was measured using a rheometer with a parallel plate fixture at room temperature. The loss modulus of the encapsulant material of the present disclosure was measured using the DMA technique. The storage modulus of the encapsulant material of the present disclosure was measured using the DMA technique.

The loss modulus relates to and/or measures the ability of the encapsulant material of the present disclosure to dissipate energy as heat. The storage modulus relates to and/or measures the elasticity of the encapsulant material of the present disclosure.

In accordance with a preferred embodiment of the present disclosure, the encapsulant material can include: a mixture of diglycidyl ether of bisphenol A and 3,4-epoxycyclohexylmethyl 3,4-epoxycyclohexanecarboxylate, wherein diglycidyl ether of bisphenol A is present in an amount of about 67 grams and 3,4-epoxycyclohexylmethyl 3,4-epoxycyclohexanecarboxylate is present in an amount of about 33 gram; 4-methylhexahydrophthalic anhydride present in an amount of about 65 grams; cobalt (II) acetylacetonate present in an amount of about 1.4 grams; glycerol in an amount of about 8 grams; and alumina nanoparticles present in an amount of 13.6 grams. An encapsulant material having the above mentioned components in the above mentioned amounts results in an improved adhesive encapsulant material having a glass transition temperature of about 130° C., a thermal expansion coefficient or coefficient of thermal expansion of about 53.23 ppm/° C., a viscosity of about 4100 cP (at room temperature), a loss modulus of about 90 MPa (at 30° C., 1 Hz) and/or a storage modulus of about 2.4 GPa (at 30° C., 1 Hz) that are suitable and/or advantageous for application of the adhesive encapsulant material in the packaging of electronic products. A reflow encapsulant material having the above mentioned components in the above mentioned amounts results in an unexpected and surprising synergy of thermal properties (i.e., glass transition temperature and coefficient of thermal expansion) and rheological properties (i.e., loss modulus, storage modulus and viscosity) that provide improved results with respect to solder bumps being reflowed and with respect to a substrate and flip-chips effectively attaching.

The glass transition temperature of the encapsulant material of the present disclosure was measured using the Dynamic Mechanical Analysis (DMA) technique. The glass transition temperature value(s) was obtained from tan delta at 1 Hz. The coefficient of thermal expansion of the encapsulant material of the present disclosure was measured using the Thermomechanical Analysis (TMA) technique. The viscosity of the encapsulant material of the present disclosure was measured using a rheometer with a parallel plate fixture at room temperature. The loss modulus of the encapsulant material of the present disclosure was measured using the DMA technique. The storage modulus of the encapsulant material of the present disclosure was measured using the DMA technique.

The loss modulus relates to and/or measures the ability of the encapsulant material of the present disclosure to dissipate energy as heat. The storage modulus relates to and/or measures the elasticity of the encapsulant material of the present disclosure.

The encapsulant material of the present disclosure can be used in conventional processes for fabricating flip-chip microelectronic assemblies.

However, in contrast to conventional encapsulant materials, the encapsulant material of the present disclosure can also be effectively used in one-cycle heating processes for fabricating flip-chip microelectronic assemblies, for example, the hybrid no-flow process or the no-flow underfill process. Conventional encapsulant materials typically cannot be used effectively in one-cycle heating processes for fabricating flip-chip microelectronic assemblies such as the hybrid no-flow process or the no-flow underfill process.

In particular, the encapsulant material of the present disclosure is the only encapsulant material that can be effectively used in the novel and inventive single-stage heating method or hybrid method disclosed in the inventors' patent application entitled "Method and Encapsulant for Flip-Chip Assembly" having the same filing date as the present patent application. On the other hand, conventional encapsulant materials cannot be used in the novel and inventive single-stage heating method or hybrid method disclosed in the inventors' patent application entitled "Method and Encapsulant for Flip-Chip Assembly" having the same filing date as the present patent application. The inventors' patent application entitled "Method and Encapsulant for Flip-Chip Assembly" having the same filing date as the present patent application is incorporated herein by reference in its entirety.

In general, with conventional encapsulant materials in the art, efforts are typically made to lower the coefficient of thermal expansion and increase the glass transition temperature of the conventional encapsulant material to make the conventional encapsulant material suitable for use in the packaging of electronic products.

In an unexpected and surprising finding, the inventors of the present disclosure discovered that while the coefficient of thermal expansion and the glass transition temperature are important in determining the suitability and effectiveness of an encapsulant material, the loss modulus and storage modulus are also important in determining the suitability and effectiveness of the encapsulant material for use in the packaging of electronic products.

For example, while the coefficient of thermal expansion of the encapsulant material of the present disclosure can be about 53.23 ppm/° C. and the glass transition temperature can be about 127° C. to about 130° C., the unexpected and surprising synergy of these thermal properties with the loss modulus measurement of about 90 MPa (at 30° C., 1 Hz) and the storage modulus measurement of about 2 GPa to about 2.4 GPa (at 30° C., 1 Hz) allows the encapsulant material to be effectively used in conventional processes, the hybrid no-flow process and/or the no-flow underfill process for fabricating flip-chip microelectronic assemblies.

While the coefficient of thermal expansion of the encapsulant material of the present disclosure can be about 53.23 ppm/° C. and the glass transition temperature can be about 127° C. to about 130° C., the unexpected and surprising synergy of these thermal properties with the loss modulus measurement of about 90 MPa (at 30° C., 1 Hz) and the storage modulus measurement of about 2 GPa to about 2.4 GPa (at 30° C., 1 Hz) allows the encapsulant material to be effectively used in the novel and inventive single-stage heating method or hybrid method disclosed in the inventors' patent application entitled "Method and Encapsulant for Flip-Chip Assembly" having the same filing date as the present patent application.

The inventors of the present disclosure found that the unexpected and surprising synergy of the thermal properties (i.e., the glass transition temperature and the coefficient of thermal expansion) and the rheological properties (i.e., the loss modulus, the storage modulus and the viscosity) of the reflow encapsulant material of the present disclosure provides the best result with respect to solder bumps being reflowed and the substrate and flip-chips effectively attaching when compared to conventional encapsulant materials.

EXAMPLE AND COMPARATIVE EXAMPLES

The present technology is further illustrated by the following examples, which should not be construed as in any way limiting.

Example 1

In accordance with an embodiment of the present disclosure, a reflow encapsulant material was prepared with a fluxing agent and alumina nanoparticles as detailed in the following table immediately below:

| Substances | Quantity (gram) |
|---|---|
| Diglycidyl ether of bisphenol A (DGEBA) | 67 |
| 3,4-Epoxycyclohexylmethyl 3,4-epoxy cyclohexanecarboxylate (Cycloaliphatic epoxy or CA) | 33 |
| 4-methylhexahydrophthalic anhydride (MHHPA) | 65 |
| Cobalt (II) acetylacetonate (CoACAC) | 1.4 |
| Glycerol | 8 |
| Alumina nanoparticles (nano Al$_2$O$_3$) | 13.6 |

The reflow encapsulant material of example 1 of the present disclosure was prepared by initially stirring a mixture of cobalt (II) acetylacetonate and 4-methylhexahydrophthalic anhydride at a temperature of about 150° C. until a homogeneous mixture A was formed. Subsequently, alumina nanoparticles were added to the homogenous mixture A at a temperature of about 150° C. and stirred until a homogeneous mixture B was formed. Homogenous mixture B was then sonicated by using a sonicator at a frequency of about 40 kilo hertz for 1 hour to effectively or appropriately disperse the alumina nanoparticles in the homogenous mixture B. Next, diglycidyl ether of bisphenol A, the cycloaliphatic epoxy resin, and glycerol were added to the homogenous mixture B and stirred at ambient temperature for about 1 hour in a vacuum atmosphere to eliminate air bubbles that can be produced during the mixing or stirring thereby forming the reflow encapsulant material of the present disclosure. Finally, any air bubbles present in the reflow encapsulant material were removed by using a vacuum pump. After removal of the air bubbles the reflow encapsulant material was loaded into a container and stored at a temperature of about −35° C.

Comparative Example 1

A reflow encapsulant material was prepared without a fluxing agent and without an inorganic filler as detailed in the following table immediately below:

| Substances | Quantity (gram) |
|---|---|
| Diglycidyl ether of bisphenol A (DGEBA) | 67 |
| 3,4-Epoxycyclohexylmethyl 3,4-epoxy cyclohexanecarboxylate (Cycloaliphatic epoxy or CA) | 33 |
| 4-methylhexahydrophtalic anhydride (MHHPA) | 65 |
| Cobalt (II) acetylacetonate (CoACAC) | 1.4 |

The reflow encapsulant material of Comparative Example 1 was prepared by stirring a mixture of cobalt (II) acetylacetonate and 4-methylhexahydrophthalic anhydride at temperature of about 150° C. until an homogeneous mixture A was formed. Subsequently, diglycidyl ether of bisphenol A and cycloaliphatic epoxy were added to the homogenous mixture A and stirred at ambient temperature for about 1 hour in a vacuum atmosphere to eliminate air bubbles that can be produced during mixing or stifling thereby forming the reflow encapsulant material. Finally, any air bubbles present in the reflow encapsulant material were removed by using a vacuum pump. After removal of the air bubbles the reflow encapsulant material was loaded into a container and stored at a temperature of about −35° C.

Comparative Example 2

A reflow encapsulant material was prepared by adding alumina nanoparticles but not adding a fluxing agent as detailed in the following table immediately below:

| Substances | Quantity (gram) |
|---|---|
| Diglycidyl ether of bisphenol A (DGEBA) | 67 |
| 3,4-Epoxycyclohexylmethyl 3,4-epoxy cyclohexanecarboxylate Cycloaliphatic epoxy or CA) | 33 |
| 4-methylhexahydrophtalic anhydride (MHHPA) | 65 |
| Cobalt (II) acetylacetonate (CoACAC) | 1.4 |
| Alumina nanoparticles (nano Al$_2$O$_3$) | 13.6 |

The reflow encapsulant material of Comparative Example 2 was prepared by stirring a mixture of cobalt (II) acetylacetonate and 4-methylhexahydrophthalic anhydride at a temperature of about 150° C. until an homogeneous mixture A was formed. Subsequently, alumina nanoparticles were added to the homogenous mixture A at a temperature of about 150° C. and stirred until a homogeneous mixture B was formed. Homogenous mixture B was then sonicated by using a sonicator at the frequency of about 40 kilo hertz for 1 hour to effectively or appropriate disperse the alumina nanoparticles in the homogenous mixture B. Then, diglycidyl ether of bisphenol A and cycloaliphatic epoxy were added to the homogenous mixture B and stirred at ambient temperature for 1 hour in a vacuum atmosphere to eliminate air bubbles that can be produced during mixing or stirring. Finally, any air bubbles present in the reflow encapsulant material were removed by using a vacuum pump. After removal of the air bubbles the reflow encapsulant material was loaded into a container and stored at a temperature of about −35° C.

Comparative Example 3

A reflow encapsulant material was prepared by adding a fluxing agent and silica nanoparticles as detailed in the following table immediately below:

| Substances | Quantity (gram) |
| --- | --- |
| Diglycidyl ether of bisphenol A (DGEBA) | 67 |
| 3,4-Epoxycyclohexylmethyl 3,4-epoxy cyclohexanecarboxylate (Cycloaliphatic epoxy or CA) | 33 |
| 4-methylhexahydrophtalic anhydride (MHHPA) | 65 |
| Cobalt (II) acetylacetonate (CoACAC) | 1.4 |
| Glycerol | 8 |
| Nanometer silica | 8 |

The reflow encapsulant material of Comparative Example 3 was prepared by stirring a mixture of cobalt (II) acetylacetonate and 4-methylhexahydrophthalic anhydride at a temperature of about 150° C. until a homogeneous mixture A was formed. Subsequently, silica nanoparticles were added to the homogenous mixture A at a temperature of about 150° C. and stirred until a homogeneous mixture B was formed. Homogeneous mixture B was then sonicated using sonicator at a frequency of about 40 kilo hertz for about 1 hour to effectively or appropriately disperse the silica nanoparticles in the homogenous mixture B. Then diglycidyl ether of bisphenol A, cycloaliphatic epoxy, and glycerol were added to the homogenous mixture B and stirred at ambient temperature for about 1 hour in a vacuum atmosphere to eliminate air bubbles that can be produced during mixing or stirring. Finally, any air bubbles present in the reflow encapsulant material were removed by using a vacuum pump. After removal of the air bubbles the reflow encapsulant material was loaded into a container and stored at a temperature of about −35° C.

Table 1 below shows the thermal properties of the reflow encapsulant material of Example 1 in accordance with an embodiment of the present disclosure and the thermal properties of the reflow encapsulant materials of Comparative Examples 1 to 3. Although the reflow encapsulant material of Comparative Example 2 exhibited the best glass transition temperature and thermal expansion coefficient values, the inventors found that if a fluxing agent was not incorporated into reflow encapsulant material, then the solder bumps will not reflow and there will be no attachment between the substrate and flip-chips. Moreover, critically, the unexpected and surprising synergy of the thermal properties (i.e., the glass transition temperature and the coefficient of thermal expansion) and the rheological properties (i.e., loss modulus, the storage modulus and the viscosity) of the reflow encapsulant material of Example 1 of the present disclosure provide the best result with respect to the solder bumps being reflowed and the substrate and flip-chips effectively attaching. The reflow encapsulant material of the present disclosure exhibited a glass transition temperature of about 130° C., a coefficient of thermal expansion of about 53.23 ppm/° C., a loss modulus of about 90 MPa, a storage modulus of about 2.4 GPa, and a viscosity of about 4100 cP.

TABLE 1

Thermal properties of the reflow encapsulant material according to the present disclosure

| | $T_g$ (° C.) | CTE1 (ppm/° C.) |
| --- | --- | --- |
| Example 1 | 130.0 | 53.23 |
| Comparative Example 1 (without fluxing agent and additive) | 134.8 | 91.58 |
| Comparative Example 2 (without fluxing agent) | 141.8 | 35.68 |
| Comparative Example 3 (the additive is nanometer silica) | 119.7 | 51.10 |

While various aspects and embodiments have been disclosed herein, it will be apparent that various other modifications and adaptations of the invention will be apparent to the person skilled in the art after reading the foregoing disclosure without departing from the spirit and scope of the invention and it is intended that all such modifications and adaptations come within the scope of the appended claims. The various aspects and embodiments disclosed herein are for purposes of illustration and are not intended to be limiting, with the true scope and spirit of the invention being indicated by the appended claims.

The invention claimed is:

1. An encapsulant material for a reflow underfill process welding a flip chip board having a solder ball to a substrate through a single heating cycle, the encapsulant material comprising:
   an epoxy resin mixture comprising a cycloaliphatic epoxy and a diglycidyl ether bisphenol A or a diglycidyl ether bisphenol F in a weight ratio of 1:3 to 3:1, the cycloaliphatic epoxy being any one or combination of 3,4-epoxycyclohexylmethyl and 3,4-epoxycyclohexanecarboxylate;
   an anhydride curing compound in an amount of 20 to 80% by weight of the epoxy resin mixture;
   a catalyst in an amount of 0.2 to 5% by weight of the epoxy resin mixture, the catalysts comprising a metal acetylacetonate, a metal acetate or any combination thereof;
   a fluxing agent in an amount of 1 to 15% by weight of the epoxy resin mixture, the fluxing agent comprising any one or combination of ethylene glycol, propylene glycol, glycerol, glycerol D-ribose, and diethylene glycol; and
   a nanoscale inorganic additive in an amount of 1 to 30% by weight of the epoxy resin mixture, the nanoscale inorganic additive being nanoscale alumina,
   wherein the single heating cycle is enabled by way of providing the encapsulant material to a first interim assembly, which is formed by placing the flip chip with the solder ball in contact with the substrate at a first temperature, to form a second interim assembly in heating at a second temperature and subjecting the second interim assembly to a third temperature sufficient to melt the solder ball, and
   wherein the second temperature is lower than the melting temperature of the solder ball and at least as high as the first temperature.

2. The encapsulant material of claim 1, wherein the anhydride curing compound is selected from the group consisting of a hexahydrophthalic anhydride, a methylhexahydrophthalic anhydride and a combination of one or more thereof.

3. The encapsulant material of claim 1, wherein the anhydride curing compound is 4-methylhexahydrophthalic anhydride.

4. The encapsulant material of claim 1, wherein the metal of the metal acetylacetonate or the metal acetate comprises a metal ion selected from the group consisting of $Sc^{3+}$, $Cu^{2+}$, $Mo^{2+}$, $Ru^{3+}$, $Rh^{3+}$, $Cd^{2+}$, $Co^{2+}$, $Co^{3+}$, $Fe^{2+}$, $Fe^{3+}$, $Pd^{2+}$, $Pt^{2+}$, $Zn^{2+}$, $Mg^{2+}$ and a combination of one or more thereof.

5. The encapsulant material of claim 1, wherein the catalyst is cobalt (II) acetylacetonate.

6. The encapsulant material of claim 1, wherein the nanoscale alumina comprising alumina nanoparticles of an average particle size 800 nanometer or less.

* * * * *